United States Patent
Mueller et al.

(10) Patent No.: US 11,837,849 B2
(45) Date of Patent: Dec. 5, 2023

(54) CONTROL CIRCUIT FOR PULSED CONTROL OF A LIGHT-EMITTING MEANS

(71) Applicant: Valeo Schalter und Sensoren GmbH, Bietigheim-Bissingen (DE)

(72) Inventors: Felix Mueller, Bietigheim-Bissingen (DE); Juergen Nies, Bietigheim-Bissingen (DE); Jochen Schenk, Bietigheim-Bissingen (DE); Daniel Stricker-Shaver, Bietigheim-Bissingen (DE)

(73) Assignee: VALEO SCHALTER UND SENSOREN GMBH, Bietigheim-Bissingen (DE)

( * ) Notice: Subject to any disclaimer, the term of this patent is extended or adjusted under 35 U.S.C. 154(b) by 64 days.

(21) Appl. No.: 17/052,311

(22) PCT Filed: Apr. 18, 2019

(86) PCT No.: PCT/EP2019/060041
§ 371 (c)(1),
(2) Date: Nov. 2, 2020

(87) PCT Pub. No.: WO2019/211099
PCT Pub. Date: Nov. 7, 2019

(65) Prior Publication Data
US 2021/0243866 A1    Aug. 5, 2021

(30) Foreign Application Priority Data

May 3, 2018    (DE) .................. 10 2018 110 583.5

(51) Int. Cl.
*H05B 45/30*    (2020.01)
*H01S 5/042*    (2006.01)
(Continued)

(52) U.S. Cl.
CPC .......... *H01S 5/0428* (2013.01); *G01S 17/931* (2020.01); *H05B 45/327* (2020.01); *H05B 45/3725* (2020.01); *H05B 45/385* (2020.01)

(58) Field of Classification Search
CPC ...... H05B 45/30; H05B 45/32; H05B 45/325; H05B 45/327; H05B 45/385; H05B 45/3725
See application file for complete search history.

(56) References Cited

U.S. PATENT DOCUMENTS 4,255,782 A * 3/1981 Joyce ..................... H02M 5/293
                                                    363/8
6,087,811 A * 7/2000 Crawford ............... H05B 41/34
                                                    320/137

(Continued)

FOREIGN PATENT DOCUMENTS

DE    102013002668 A1    8/2014
DE    102014111085 A1    2/2015

OTHER PUBLICATIONS

International Search Report and Written Opinion in corresponding International Application No. PCT/EP2019/060041, dated Jun. 5, 2019 (11 pages).

(Continued)

*Primary Examiner* — Tung X Le
(74) *Attorney, Agent, or Firm* — Osha Bergman Watanabe & Burton LLP

(57) ABSTRACT

The invention relates to a control circuit (50) for pulsed control of a light-emitting means (52), in particular an LED or a laser diode (52), having a switched-mode power supply unit (54) with a first switch (64) arranged in a primary circuit of the switched-mode power supply unit (54), wherein the switched-mode power supply unit (54) has a primary-side connector (62) for connection to a supply voltage, a sec- (Continued)

Figure 1:
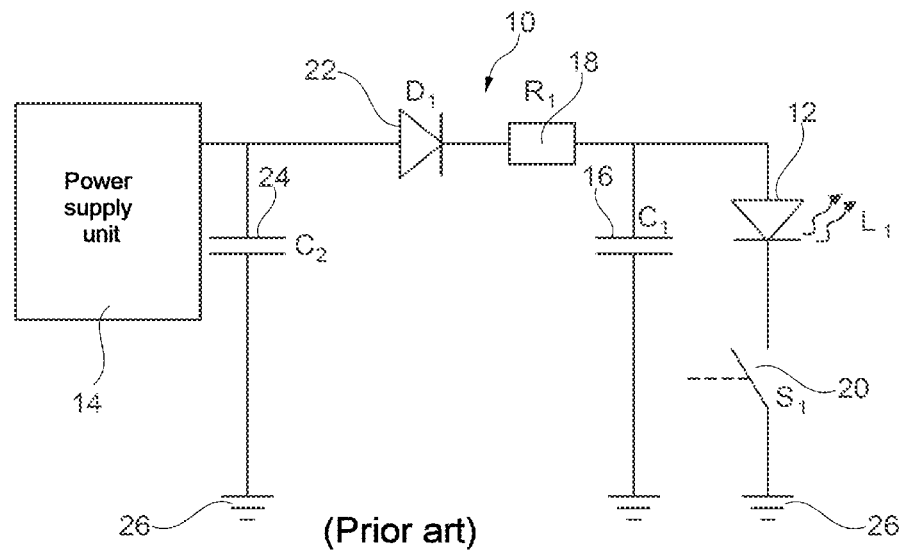

ondary-side connector (67) for supplying the light-emitting means (52) and a switching input (65) for operating the first switch (64), having a storage capacitor (68) arranged between the secondary-side connector (67) and a ground (66), having a second switch (70) arranged in a current path (71) in parallel with the storage capacitor (68), wherein the light-emitting means (52) is positionable in the current path (71), and having a control unit (72) to control the first and the second switch (64, 70), wherein the control unit (72) is designed to operate the first switch (64) in order to induce at least one charge pulse for charging the storage capacitor (68) in the secondary circuit and to operate the second switch (70) in order to discharge the storage capacitor (68) while generating a light pulse (82) via the light-emitting means (52). The invention also relates to a LiDAR-based environmental sensor, in particular a laser scanner, for use in a vehicle, having an abovementioned control circuit (50) and a laser diode (52). The invention further relates to a method for the pulsed control of a light-emitting means (52), in particular an LED or a laser diode (52), comprising the steps of providing a storage capacitor (68) and a current path (71) that is parallel thereto and in which the light-emitting means (52) is arranged, of generating at least one charge pulse for charging the storage capacitor (68), and of discharging the storage capacitor (68) via the light-emitting means (52) while generating a light pulse (82).

11 Claims, 2 Drawing Sheets

(51) Int. Cl.
*H05B 45/327* (2020.01)
*H05B 45/3725* (2020.01)
*G01S 17/931* (2020.01)
*H05B 45/385* (2020.01)

(56) References Cited

U.S. PATENT DOCUMENTS

| | | | | |
|---|---|---|---|---|
| 6,856,119 | B2* | 2/2005 | Crawford | H02M 1/4208 320/166 |
| 7,382,633 | B2* | 6/2008 | Aso | H02M 3/335 363/21.04 |
| 7,646,989 | B2* | 1/2010 | Kato | H05B 45/38 398/189 |
| 8,466,628 | B2* | 6/2013 | Shearer | H05B 47/155 315/219 |
| 9,368,936 | B1 | 6/2016 | Lenius et al. | |
| 9,954,445 | B2* | 4/2018 | Gritti | H02M 3/33507 |
| 10,314,129 | B2* | 6/2019 | Kober | H05B 45/3725 |
| 2011/0085576 | A1* | 4/2011 | Crawford | H05B 45/44 372/38.07 |
| 2013/0119875 | A1* | 5/2013 | Dearborn | H02M 3/335 363/21.18 |
| 2013/0135774 | A1* | 5/2013 | Li | H05B 45/54 361/18 |
| 2014/0306530 | A1* | 10/2014 | Theiler | H02M 3/1584 307/31 |
| 2014/0354170 | A1* | 12/2014 | Gredler | H05B 45/375 315/224 |
| 2015/0069908 | A1* | 3/2015 | Fukui | H05B 45/48 315/193 |
| 2016/0088697 | A1* | 3/2016 | Yan | H05B 45/10 315/307 |
| 2016/0143108 | A1* | 5/2016 | Nakamura | H05B 45/385 315/224 |
| 2017/0027030 | A1 | 1/2017 | Wang et al. | |
| 2018/0323576 | A1* | 11/2018 | Crawford | H02M 1/088 |

OTHER PUBLICATIONS

German Search Report in corresponding German Application No. 10 2018 110 583.5, dated Jan. 22, 2019 (10 pages).

\* cited by examiner

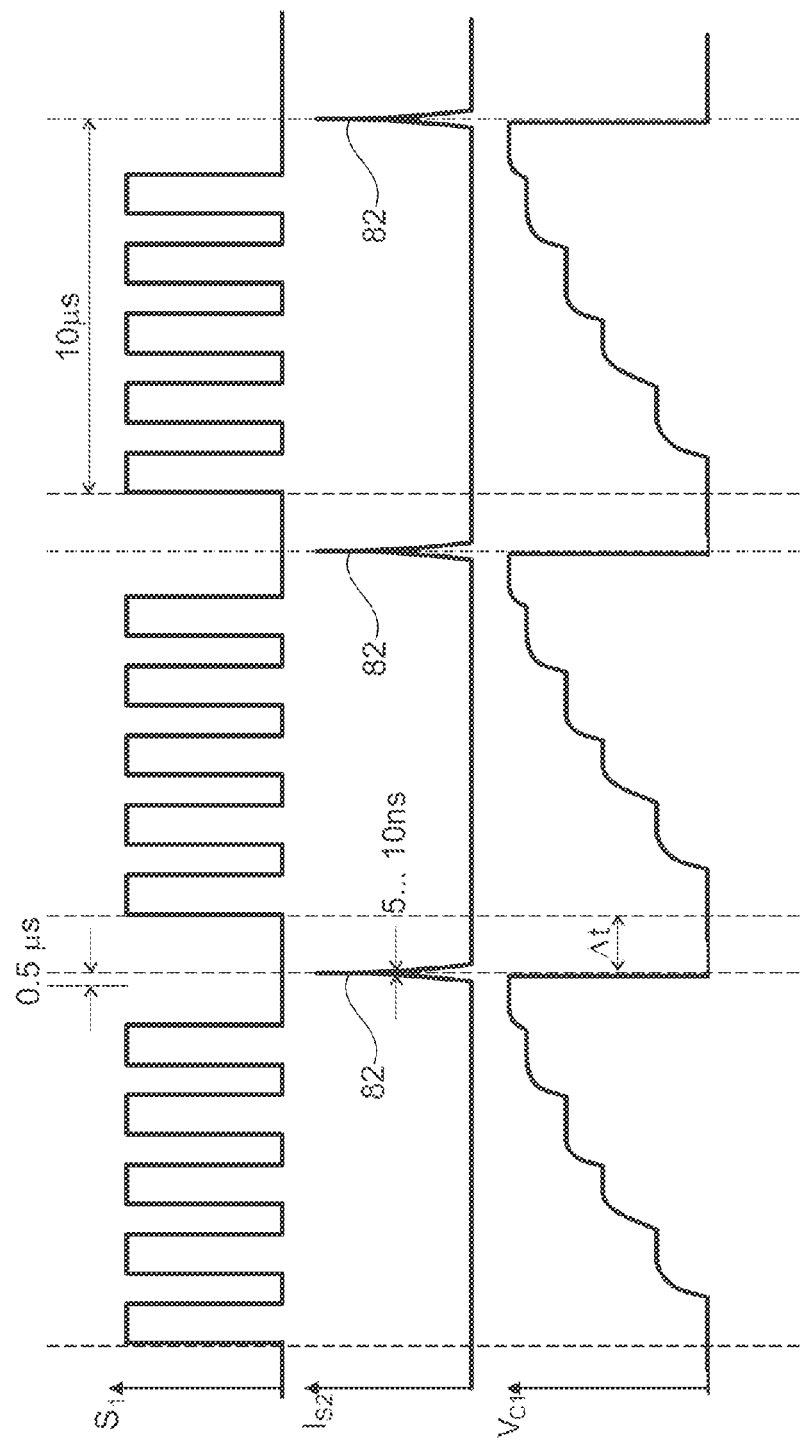

CONTROL CIRCUIT FOR PULSED CONTROL OF A LIGHT-EMITTING MEANS

The present invention relates to a control circuit for pulsed control of a light-emitting means, in particular an LED or a laser diode.

The present invention also relates to a LiDAR-based environmental sensor, in particular a laser scanner, for use in a vehicle, having an abovementioned control circuit and a laser diode.

In addition, the present invention relates to a method for the pulsed control of a light-emitting means, in particular an LED or a laser diode.

Current vehicles are increasingly equipped with driving assistance systems that support, as driver assistance systems, a driver of the vehicle during driving or provide information as a basis for a support function during autonomous or partially autonomous driving of the vehicle. Typically, environmental information is captured and evaluated using an environmental sensor or a plurality of environmental sensors to create an environment map.

The use of LiDAR-based environmental sensors, for example laser scanners, increasingly gains importance here. LiDAR-based environmental sensors operate according to the principle of time-of-flight measurement of emitted laser pulses to capture the environment of the vehicle. The laser pulses are generated by a laser diode that is driven in pulsed fashion. In the process, pulses having a pulse duration of, for example, 5 nanoseconds are used. In order to ensure continuous monitoring of the environment and to be able to reliably capture moving objects, the environment must be captured completely several times per second. In order to implement this with a point-wise scanning of the environment, pulse frequencies in the kilohertz range may be necessary. The requirements relating to the control circuit, which must ensure high-frequency generation of constant laser pulses in continuous use, are correspondingly high. The laser diode in pulsed operation is frequently driven with voltages of several tens to a few hundred volts. This voltage can thus lie above typical vehicle system voltages. Vehicle system voltages of twelve volts are typical in passenger cars at present, wherein a development to vehicle systems having a higher voltage of, for example, 24 volts or even 48 volts has already begun. Even at these voltages, however, voltage conversion from the vehicle electrical system to the pulse drive voltage of the laser diode is necessary. The stated functions are typically performed by a control circuit.

A control circuit 10 known from the prior art is shown in FIG. 1 together with a laser diode 12 for controlling the laser diode 12 in a LiDAR-based environmental sensor for automotive use in a vehicle. The control circuit 10 comprises a power supply unit 14, which is connected on the input side to an electrical system of the vehicle. The power supply unit 14 provides DC voltage of typically several tens to a few hundred volts. The power supply unit 14 can be embodied, for example, with a step-up converter, also referred to as boost converter, to generate said DC voltage from the electrical system voltage of the vehicle. A storage capacitor 16, which is charged by the power supply unit 14 via a charging series resistor 18, is connected to the power supply unit on the output side. The charging series resistor 18 determines here the charging speed of the storage capacitor 16.

The laser diode 12 is connected, via a switch 20, in parallel with the storage capacitor 16. In addition, a diode 22, which blocks a reverse current from the storage capacitor 16 into the power supply unit 14, is arranged between the power supply unit 14 and the charging series resistor 18. A smoothing capacitor 24 is connected to the power supply unit 14 on the output side.

When the switch 20 is operated, i.e. closed, the storage capacitor 16 is connected via the laser diode 12 to a ground 26 of the control circuit 10. The storage capacitor 16 is thus discharged via the laser diode 12, generating a laser pulse in the process. In this control circuit 10, the storage capacitor 16 is continuously charged via the charging series resistor 18.

A disadvantage of such a control circuit is that losses occur at the charging series resistor when charging the storage capacitor. The losses generate heat at the charging series resistor. This heat may also heat the laser diode. The laser diode is typically highly sensitive to temperatures, with the result that the properties of the laser diode change quickly if it heats up. This change is typically undesirable. For example, a wavelength shift of the laser diode may occur if it heats up. In addition, as the temperature rises, typically the efficiency of the laser diode and of the control circuit overall decreases. When controlling LEDs, there are in principle comparable influences of the temperature. A sufficient spatial separation of the charging series resistor and the laser diode so as to avoid the laser diode heating up due to the charging series resister is practically not able to be implemented. It may therefore be necessary to provide additional cooling devices, which is associated with a high outlay and corresponding costs. Owing to the generation of heat, overall a larger construction for example of the LiDAR-based environmental sensor as a whole is necessary, which is always associated with disadvantages in automotive applications with a limited availability of space. If the switch is defective, there is also the risk that the laser diode permanently emits light. Such operation, however, is not permissible because it is not eye-safe. The laser diode is also not decoupled from the vehicle electrical system. Typical step-up converters themselves do not provide any decoupling.

In this context, an illumination assembly and an illumination apparatus using the former are known from DE 10 2014 111 085 A1. A controller in that respect has a first mode and a second mode. The first mode consists in generating a PWM signal that has a duty cycle that is to be changed in accordance with an illumination degree for a light-emitting element and has a constant amplitude. The second mode consists in generating a PAM signal that has a constant duty cycle and has an amplitude that is to be changed in accordance with the illumination degree for the light-emitting element. The controller is configured for applying one of the PWM signals in the first mode and the PAM signal in the second mode to a control connector of a circuit element if the illumination degree is a predetermined illumination degree or lies above it. The controller is configured for applying the other one of the PWM signals in the first mode and the PAM signal in the second mode to the control connector of the circuit element if the illumination degree lies under the predetermined illumination degree.

Starting from the abovementioned prior art, the invention is thus based on the object of specifying a control circuit of the abovementioned type and a method for the pulsed control of a light-emitting means that at least partially overcome the abovementioned disadvantages. In particular, the invention is based on the object of specifying a control circuit of the abovementioned type and a method for the pulsed control of a light-emitting means that ensure low heating of the light-emitting means.

The object is achieved according to the invention by the features of the independent claims. Advantageous refinements of the invention are specified in the dependent claims.

According to the invention, a control circuit for pulsed control of a light-emitting means, in particular an LED or a laser diode, having a switched-mode power supply unit with a first switch arranged in a primary circuit of the switched-mode power supply unit, wherein the switched-mode power supply unit has a primary-side connector for connection to a supply voltage, a secondary-side connector for supplying the light-emitting means and a switching input for operating the first switch, having a storage capacitor arranged between the secondary-side connector and a ground, having a second switch arranged in a current path in parallel with the storage capacitor, wherein the light-emitting means is positionable in the current path, and having a control unit to control the first and the second switch, wherein the control unit is designed to operate the first switch in order to induce at least one charge pulse for charging the storage capacitor in the secondary circuit and to operate the second switch in order to discharge the storage capacitor while generating a light pulse via the light-emitting means, is thus specified.

According to the invention, a LiDAR-based environmental sensor, in particular a laser scanner, for use in a vehicle having an abovementioned control circuit and a laser diode is likewise specified.

According to the invention, a method for the pulsed control of a light-emitting means, in particular an LED or a laser diode, is additionally specified, comprising the steps of providing a storage capacitor and a current path that is parallel thereto and in which the light-emitting means is arranged, of generating at least one charge pulse for charging the storage capacitor, and of discharging the storage capacitor via the light-emitting means while generating a light pulse.

The basic concept of the present invention is thus to charge the storage capacitor by way of pulsed charging via the switched-mode power supply unit. Consequently, a charging series resistor as is typical in the prior art is not necessary and can be dispensed with, as a result of which ohmic losses in the control circuit are reduced. The control circuit thus generates less heat, as a result of which the light-emitting means is heated less and the properties thereof change little. In laser diodes, a wavelength shift is thus reduced or avoided. In addition, the light-emitting means can operate with high efficiency. Losses in the control circuit itself are also reduced. Requirements in terms of additional cooling devices are reduced or eliminated. The switched-mode power supply unit additionally brings about decoupling between the supply voltage and the secondary side, as a result of which feedback effects on the supply voltage due to the light pulses are reduced and EMC properties of the control circuit are improved.

The use of the current pulses moreover permits targeted charging of the storage capacitor, wherein the charging current can be set well. A maximum current can be limited. Heating of coils in the switched-mode power supply unit is thus also reduced. Magnetization losses only occur when current flows through the switched-mode power supply unit, that is to say while the charge pulses are generated. As a result, the control circuit as a whole can be optimized in terms of construction sizes and losses. By charging the storage capacitor with charge pulses, a low alternating current load of the supply voltage is generated, which is favourable for good EMC properties of the control circuit and of the LiDAR-based environmental sensor.

The switched-mode power supply unit typically comprises a transformer with a primary coil and a secondary coil, which are magnetically coupled. In this way, electric decoupling of the primary side and secondary side of the switched-mode power supply unit is effected. The first switch is arranged in the primary circuit of the switched-mode power supply unit to allow a current through the primary coil upon operation. The first switch is designed, for example, for control with 50 kHz to 500 kHz. This is usually sufficient for application in LiDAR-based environmental sensors. In more powerful environmental sensors, faster control may be necessary to be able to generate laser pulses in quicker succession.

The switched-mode power supply unit is connected at its primary-side connector to the supply voltage. In a vehicle, this is typically a vehicle system voltage of typically 12V, 24V or 48V. The vehicle system voltage is typically DC voltage. The switched-mode power supply unit is preferably designed to generate, on the secondary side, a voltage of up to a few hundred volts, for example up to 300V. With particular preference, the switched-mode power supply unit provides a voltage of approximately 150 volts to 200 volts on the secondary side.

The storage capacitor is connected to the secondary-side connector and is charged via it with the charge pulses. The storage capacitor can in principle be any capacitor, for example an electrolytic capacitor, a ceramic capacitor, a plastic film capacitor or a metal paper capacitor.

The second switch serves for generating the light pulses. The light pulses typically have a duration in the range of a few nanoseconds. It is not absolutely necessary here to open the second switch again correspondingly fast because, after the discharge of the storage capacitor, current can only flow through the light-emitting means again when the storage capacitor is recharged. However, charging only begins with the next charge pulse. The light pulses are generated for example with a period in the range of a few microseconds, for example ten to fifty microseconds.

The control unit can in principle be any data processing device to control the first and second switches so as to operate them. The operation of the respective switch here corresponds to a closing of the corresponding electric circuit, thus enabling current to flow. It is not important here what type of control is used for the operation, for example using a digital level, which may be 'high' or 'low'. The control unit controls the first switch via the switching input. The first and the second switch can here be controlled with a regular signal in the manner of a clock signal. This is particularly easy to produce in the control unit. Alternatively, the switches can be operated in each case with at least partially irregular signals.

By closing the first switch, current can flow through the primary winding of the switched-mode power supply unit. The current increase is limited here by the coil. A current is induced in the secondary winding, wherein the current is transformed according to the transformation ratio of the primary winding to the secondary winding. This applies correspondingly to the voltage. The induced current charges the storage capacitor as a charge pulse. The charge pulse is generated here with a delay with respect to the controlling of the first switch.

During the operation of the second switch, the storage capacitor is connected to ground via the light-emitting means. The storage capacitor is thereby discharged in the manner of a pulse. The resulting current flowing through the light-emitting means generates a corresponding light pulse.

The discharge of the storage capacitor via the light-emitting means while generating a light pulse is brought about by a pulse discharge of the storage capacitor. The generation of the light pulse is thus accompanied by the electrical pulse discharge of the storage capacitor. To this extent, the generation of the light pulse can be equated to the pulse discharge of the storage capacitor. The generation of the light pulse is triggered immediately by the operation of the second switch.

In an advantageous configuration of the invention, the control circuit has a diode that is arranged at the secondary-side connector of the switched-mode power supply unit to block a reverse current from the storage capacitor into the switched-mode power supply unit. In this way, the storage capacitor can be charged without problems and hold its charge up to the point of use, i.e. a discharge via the light-emitting means. The diode has a dielectric strength that is dependent on the design of the control circuit in order to block the maximum voltage at the storage capacitor and not to be damaged by the current pulses from the switched-mode power supply unit. In principle a plurality of individual diodes can also be series-connected to achieve a sufficient reverse voltage and prevent reverse current from the storage capacitor into the switched-mode power supply unit.

In an advantageous configuration of the invention, the control unit is designed to operate the first switch and the second switch such that the charge pulses and the light pulses are generated with a temporal offset. In this way it is ensured that the charge pulses of the switched-mode power supply unit cannot flow directly into the light-emitting means and the switched-mode power supply unit is not connected to ground on the secondary side. This could result in an uncontrolled behaviour of the circuit and in damage to the light-emitting means and/or to the switch. The first and the second switch are typically also operated with a temporal offset. However, the delay between the operation of the first switch and the induction of the charge pulse should be taken into account when controlling the switches. Preferably, the two switches are controlled and the charge pulses and the light pulses are generated such that a temporal safety distance is provided between the charge pulse and the light pulse. The safety distance can be, for example, half a pulse duration of the charge pulse or the light pulse.

In an advantageous configuration of the invention, the control circuit is designed to operate the first switch so as to charge the storage capacitor with charge pulses until a specified capacitor voltage is reached. The capacitor voltage is dependent on the charge of the storage capacitor. The voltage required for generating the light pulse is specified by the design of the control circuit and by the light-emitting means. In this way, pulsed operation of the light-emitting means is made possible by a corresponding charge of the storage capacitor. Preferably, charging is effected with a plurality of individual pulses. With particular preference, each individual pulse here supplies the same energy. Alternatively, different charge pulses can be combined, in particular charge pulses with different pulse durations. It is also possible for the charge pulses to be generated at regular temporal distances. Alternatively, the charge pulses can be generated in a temporally variable manner. A high flexibility when generating the charge pulses can be utilized to control electromagnetic emission in a targeted manner and to thereby satisfy specifications for example relating to electromagnetic compatibility (EMC).

In an advantageous configuration of the invention, the control unit is designed to charge the storage capacitor with a specified number of charge pulses. The number of the charge pulses can be determined in dependence on the design of the control circuit and a selection of the light-emitting means as design parameters and be implemented fixedly in the control circuit. From the requirements relating to the light pulse to be generated and the selection of the light-emitting means used together with parameters of the control circuit, it is possible to determine a required charge quantity with which the storage capacitor must be charged. In dependence thereon, the number of the charge pulses can be determined. The number of the charge pulses can here be determined in dependence on different pulse durations, for example to use different charge pulses in subsequent charges of the storage capacitor or during an individual charge of the storage capacitor. For each pulse duration, a respective amount of energy that is supplied to the storage capacitor can be determined.

In an advantageous configuration of the invention, the control unit is designed to charge the storage capacitor with the specified number of charge pulses directly before the discharge of the storage capacitor via the light-emitting means. In this way, charging of the storage capacitor can be performed appropriately. Charge losses for example due to a self-discharge of the storage capacitor can be reduced.

In an advantageous configuration of the invention, the control circuit has a measurement apparatus for measuring a voltage across the storage capacitor. The voltage required for generating the light pulse is specified by the design of the control circuit and by the light-emitting means. The voltage of the storage capacitor can thus be monitored directly to ascertain a state of charge of the storage capacitor and to generate further charge pulses depending on the voltage. When the required voltage for generating the light pulse is reached, no further charge pulses are generated. With dynamic monitoring of the voltage of the storage capacitor, it is possible where appropriate for recharging to occur if the storage capacitor has partially discharged, for example by way of self-discharge, and the voltage has correspondingly dropped.

In an advantageous configuration of the invention, the control unit is implemented as an FPGA. FPGAs (field programmable gate arrays) allow a simple implementation of different functions in hardware that, with little resources, makes a high performance possible.

In an advantageous configuration of the invention, the second switch is implemented as a transistor, in particular as a field effect transistor. Such transistors can perform fast switching processes and, moreover, produce only small losses. The second switch can also comprise a combination of a plurality of interconnected transistors to make a desired dielectric strength and a desired pulse current possible. The transistor has a dielectric strength that is dependent on the design of the control circuit in order to block the maximum voltage at the storage capacitor and not to be damaged by the current pulses from the storage capacitor.

This applies correspondingly in principle to the first switch, which may be implemented as a transistor to perform fast switching processes to generate the at least one charge pulse.

In an advantageous configuration of the invention, the steps for generating at least one charge pulse and for discharging the storage capacitor via the light-emitting means while generating a light pulse take place with a temporal offset without overlap. Charge pulses and light pulses, that is to say pulse discharges of the storage capacitor thus occur with a temporal offset. In this way, the switched-mode power supply unit is prevented from being able to be connected to ground on the secondary side directly via the light-emitting means. Currents that occur in the process could destroy the control circuit and/or the light-emitting means. The behaviour of the light-emitting means can practically not be controlled here either.

The invention is explained in more detail below with reference to the attached drawing and on the basis of preferred embodiments. The features described can represent an aspect of the invention both individually and in combination. Features of different exemplary embodiments can be transferred from one exemplary embodiment to another.

Figure 2:
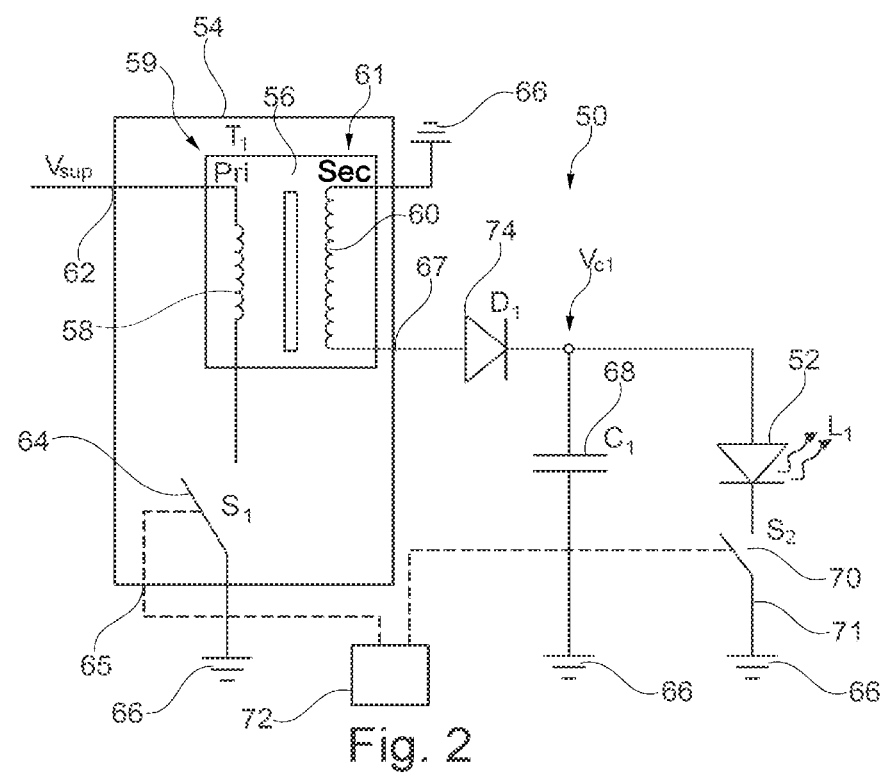

In the drawings:

FIG. 1 shows a circuit diagram of a control circuit used in the prior art for pulsed control of a light-emitting means together with the light-emitting means, FIG. 2 shows a circuit diagram of a control circuit for pulsed control of a light-emitting means together with the light-emitting means according to a first, preferred embodiment, and FIG. 3 shows a time profile of control signals for a first switch of the control circuit for charging a storage capacitor, a profile of a discharge current and for discharging the storage capacitor via the second switch while generating a light pulse via the light-emitting means and with a resulting voltage profile at the storage capacitor using the control circuit of the first embodiment.

FIG. 2 shows a control circuit 50 for the pulsed control of a light-emitting means 52 according to a first, preferred embodiment. The light-emitting means 52 is here implemented as a laser diode 52. The control circuit 50 and the laser diode 52 are part of a LiDAR-based environmental sensor for use in a vehicle.

The control circuit 50 comprises a switched-mode power supply unit 54. The switched-mode power supply unit 54 comprises a transformer 56 with a primary coil 58 arranged on a primary side 59 of the switched-mode power supply unit 54 and a secondary coil 60 arranged on a secondary side 61 of the switched-mode power supply unit 54. The primary coil 58 and the secondary coil 60 are magnetically coupled. The switched-mode power supply unit 54 has, on its primary side 59, a connector 62 for connecting to a supply voltage $V_{sup}$. The supply voltage $V_{sup}$ is a vehicle system voltage as DC voltage with 12V. Alternatively, the vehicle system voltage can be 24V or 48V.

A first switch 64 via which the primary coil 58 is connected to a ground 66 upon operation via a switching input 65 is arranged on the primary side 59 of the switched-mode power supply unit 54. Thus, when the first switch 64 is operated, a current flows through the primary coil 58. The first switch 64 is designed, for example, for control with approximately 500 kHz. The first switch 64 is implemented as a transistor, for example as a field effect transistor.

The switched-mode power supply unit 54 is furthermore designed to provide a voltage of approximately 150 volts to 200 volts on the secondary side 61 via a secondary-side connector 67 to supply the laser diode 52.

The control circuit 50 furthermore comprises a storage capacitor 68, which is arranged between the secondary-side connector 67 and ground 66. The storage capacitor 68 is here, by way of example, an electrolytic capacitor.

The control circuit 50 additionally comprises a second switch 70, which is arranged together with the laser diode 52 in a current path 71 in parallel with the storage capacitor 68. The second switch 70 is also implemented as a transistor, for example as a field effect transistor.

The control circuit 50 furthermore comprises a control unit 72 that controls the first and the second switch 64, 70.

The control unit 72 is implemented here as an FPGA. The operation of the respective switch 64, 70 here corresponds to a closing of the corresponding electric circuit, thus enabling current to flow. Details relating to the controlling of the switches 64, 70 will be described below with reference to FIG. 3.

Finally, the control circuit 50 in this exemplary embodiment has a diode 74 that is arranged at the secondary-side connector 67 of the switched-mode power supply unit 54 and blocks a reverse current from the storage capacitor 68 into the switched-mode power supply unit 54.

The control unit 72 is designed to operate the first switch 64 to induce charge pulses for charging the storage capacitor 68 on the secondary side in the switched-mode power supply unit 54. In addition, the control unit 72 is designed to operate the second switch 70 to discharge the storage capacitor 68 via the laser diode 52, wherein the laser diode 52 emits a light pulse 82, which is a laser pulse 82 in the present case. Details are shown in FIG. 3.

The control unit 72 initially controls the first switch 64 to generate five charge pulses. By closing the first switch 64, a current can flow in each case through the primary coil 58 of the switched-mode power supply unit 54. The current increase is limited here by the primary coil 58. A current is induced in the secondary coil 60, which current is transformed according to a transformation ratio of the primary coil 58 to the secondary coil 60. The induced current serves in each case as a charge pulse for the storage capacitor 68, wherein the charge pulse is generated with a delay with respect to the control of the first switch. With each charge pulse, the charge quantity in the storage capacitor 68 increases, as a result of which the capacitor voltage $V_{C1}$ increases. The five charge pulses are generated within 10 microseconds. The five charge pulses have the same pulse duration, which means they each transfer the same amount of energy and successively increase the voltage at the storage capacitor 68. Alternatively, the charge pulses can have different pulse durations. In addition, the charge pulses have the same temporal distance from one another.

The switched-mode power supply unit 54 additionally has a measurement apparatus (not shown) for measuring a voltage across the storage capacitor 68. Accordingly, the voltage of the storage capacitor 68 is monitored. When the voltage exceeds a specified value, the first switch 64 is deactivated and no further charge pulses are generated.

As FIG. 3 furthermore shows, after the five charge pulses have been generated by operating the first switch 64 five times, the second switch 70 is operated after a duration of, in the present case, 0.5 microseconds, as a result of which the storage capacitor 68 is connected to ground 66 via the laser diode 52. The storage capacitor 68 is thereby discharged in a pulse-type manner, wherein the current flows through the laser diode 52 via ground 66, with the result that the laser pulse 82 is accordingly generated in the laser diode 52. The laser pulse 82 here has a duration in the range from five to ten nanoseconds. As is shown in FIG. 3, the control of the first switch 64 and of the second switch 70 is synchronized such that the five charge pulses are generated together with the duration of 0.5 microseconds directly before the discharging of the storage capacitor 68 via the laser diode 52. Accordingly, a time Δt during which the first switch is not operated to generate charge pulses occurs between each laser pulse 82 and the respectively first of the five charge pulses.

The control unit 72 thus operates the first switch 64 and the second switch 70 each in alternation in a manner such that the charge pulses and the light pulses 82 are generated with a temporal offset.

LIST OF REFERENCE SIGNS

10 Control circuit (prior art)
12 Laser diode (prior art)
14 Power supply unit (prior art)
16 Storage capacitor (prior art)
18 Charging series resistor (prior art)
20 Switch (prior art)
22 Diode (prior art)
24 Smoothing capacitor (prior art)
26 Ground (prior art)
50 Control circuit
52 Light-emitting means, laser diode
54 Switched-mode power supply unit
56 Transformer
58 Primary coil
59 Primary side
60 Secondary coil
61 Secondary side
62 Connector for supply voltage
64 First switch
65 Switching input
66 Ground
67 Secondary-side connector
68 Storage capacitor
70 Second switch
71 Current path
72 Control unit
74 Diode
82 Light pulse, laser pulse

The invention claimed is:

1. A control circuit for pulsed control of a light-emitting means, the control circuit comprising:
   a switched-mode power supply unit with a first switch arranged in a primary circuit of the switched-mode power supply unit, wherein the switched-mode power supply unit has a primary-side connector for connection to a supply voltage, a secondary-side connector for supplying the light-emitting means and a switching input for operating the first switch;
   a storage capacitor arranged between the secondary-side connector and a ground;
   a second switch arranged in a current path in parallel with the storage capacitor, wherein the light-emitting means is positionable in the current path; and
   a control unit to control the first and the second switch, wherein the control unit is configured to operate the first switch in order to induce at least one charge pulse for charging the storage capacitor in a secondary circuit and to operate the second switch in order to discharge the storage capacitor while generating a light pulse via the light-emitting means, and
   wherein the control unit is configured to coordinate operation of the first and second switches such that, at no time, the first switch and the second switch are simultaneously closed.

2. The control circuit according to claim 1, wherein the control circuit has a diode that is arranged at the secondary-side connector of the switched-mode power supply unit and blocks a reverse current from the storage capacitor into the switched-mode power supply unit.

3. The control circuit according to claim 1, wherein the control unit is configured to operate the first switch and the second switch such that the charge pulses and the light pulses are generated with a temporal offset.

4. The control circuit according to claim 1, wherein the control circuit is configured to operate the first switch so as to charge the storage capacitor with charge pulses until a specified capacitor voltage is reached.

5. The control circuit according to claim 4, wherein the control unit is configured to charge the storage capacitor with a specified number of charge pulses.

6. The control circuit according to claim 5, wherein the control unit is configured to charge the storage capacitor with the specified number of charge pulses directly before the discharge of the storage capacitor via the light-emitting means.

7. The control circuit according to claim 4, wherein the control circuit has a measurement apparatus for measuring a voltage across the storage capacitor.

8. The control circuit according to claim 1, wherein the control unit is implemented as an FPGA.

9. The control circuit according to claim 1, wherein the second switch is implemented as a field effect transistor.

10. A LiDAR-based environmental sensor for use in a vehicle, comprising: a control circuit according to claim 1; and a laser diode.

11. The control circuit of claim 1, wherein the light-emitting means is one of a LED and a laser diode.

* * * * *